United States Patent [19]

Allan

[11] Patent Number: 4,656,612

[45] Date of Patent: Apr. 7, 1987

[54] DRAM CURRENT CONTROL TECHNIQUE

[75] Inventor: James D. Allan, Colorado Springs, Colo.

[73] Assignee: Inmos Corporation, Colorado Springs, Colo.

[21] Appl. No.: 672,907

[22] Filed: Nov. 19, 1984

[51] Int. Cl.[4] ............................................. G11C 11/40
[52] U.S. Cl. .................................... 365/203; 307/591; 365/194; 365/211
[58] Field of Search ................. 365/194, 203, 211, 190, 365/226, 227, 205, 207, 189; 307/591, 603, 310

[56] References Cited

U.S. PATENT DOCUMENTS

| 3,705,392 | 12/1972 | Appelt | 365/227 |
| 3,996,481 | 12/1976 | Chu et al. | 307/481 |
| 4,081,701 | 3/1978 | White, Jr. et al. | 365/203 |
| 4,222,112 | 9/1980 | Clemons et al. | 365/194 |
| 4,223,396 | 9/1980 | Kinoshita | 365/194 |

FOREIGN PATENT DOCUMENTS 54-150045 11/1979 Japan ..................................... 365/227

Primary Examiner—Terrell W. Fears

Attorney, Agent, or Firm—Edward D. Manzo; Roger R. Wise

[57] ABSTRACT

In a DRAM, current surges during sense and restore operations are compensated. Peak current through sense amplifiers is stabilized through initiation of the sense and restore operations during the chip active period and completion of the sense and restore operation during the chip precharge period. The delay between first and second sensing signals is controlled to be longer for those temperature and power supply conditions under which the chip is operating fastest. Correspondingly, the delay between first and second sensing signals is made shorter for those temperature and power supply conditions under which the chip is operating slowest. Overall peak current is limited to that drawn through small transistors used to begin turning on the sense amplifier. The duration of the second sensing signal is responsive to the temperature and power supply variation so it endures for an acceptable period in which to complete the sense and restore function. The second sensing signal timing is not determined by the first sensing signal.

14 Claims, 5 Drawing Figures

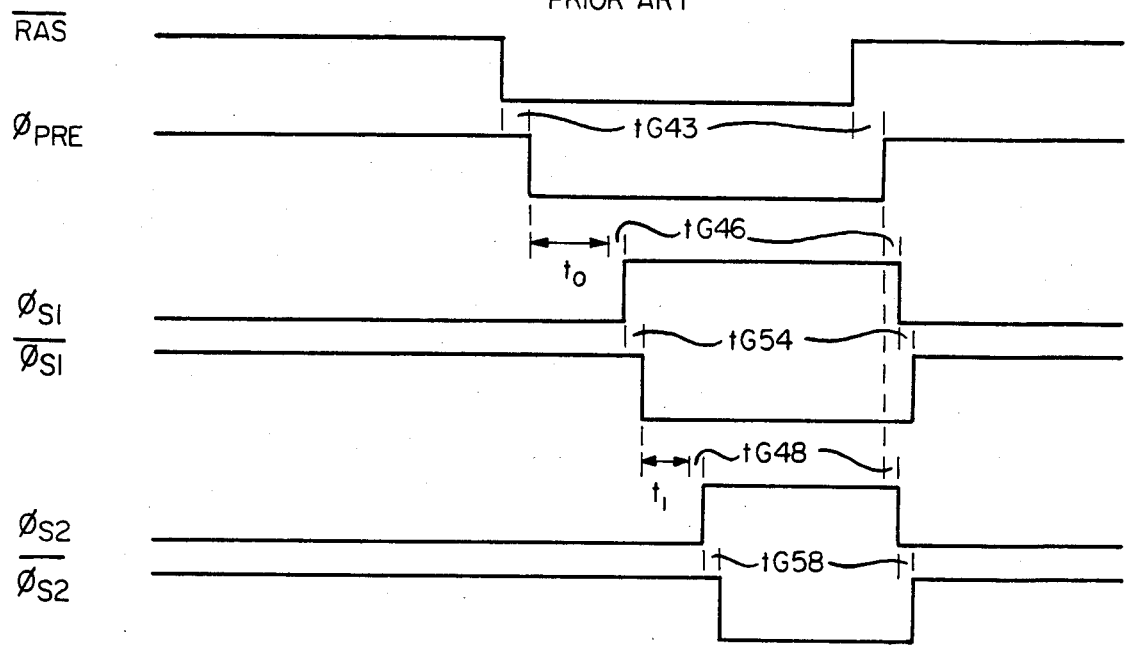
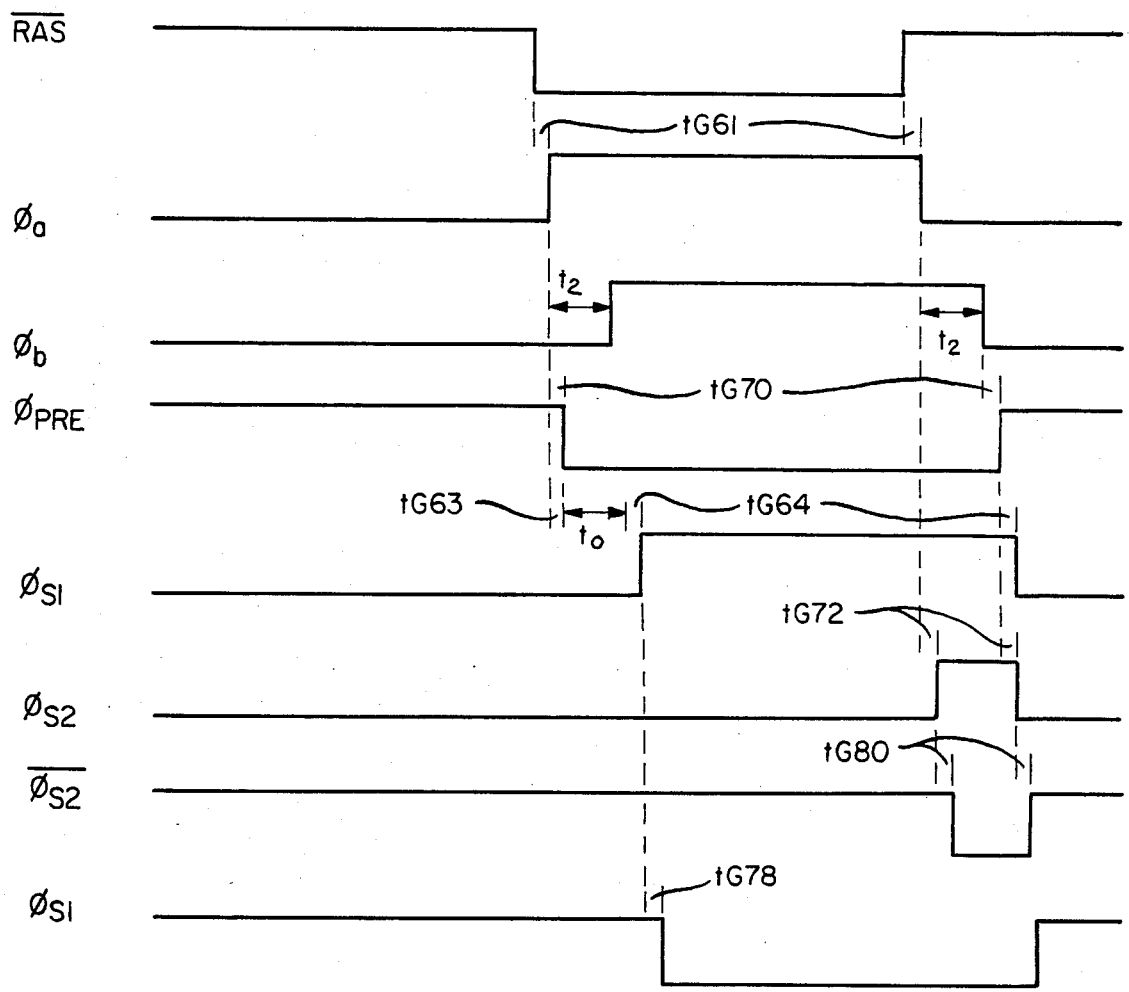

DRAM CURRENT CONTROL TECHNIQUE

BACKGROUND OF THE INVENTION

The present invention relates generally to the semiconductor circuitry art. More particularly, the present invention relates to a technique for controlling the current drawn through a semiconductor memory device during high speed operation.

More particularly, in the operation of a dynamic random access memory (DRAM), considerable power supply current surges may be generated. These typically result from the large capacitance associated with the bit lines, along which memory cells are located, which capacitance must be overcome during charging and discharging each cycle.

In DRAMs, the logical complement $\overline{RAS}$ of a row address strobe RAS is used to define a "cycle." Such a cycle may include nominally 100 to 120 nanoseconds, during which $\overline{RAS}$ will be high for 40 nanoseconds or so. The time between the high to low edge of $\overline{RAS}$ and the next low to high edge of $\overline{RAS}$ is called the "active period." When $\overline{RAS}$ is high in DRAMs of the prior art, precharging of the bit lines will occur. During the ensuing active period, the decoders are set up to access the intended memory cell. Afterwards, but still during the active period, the sensing and restore operations occur. These terminate when $\overline{RAS}$ goes high, signalling the end of the active period.

For example, in a fast 256K CMOS DRAM there are typically 1024 pairs of bit lines, each having a capacitance of typically 800 femtofarads (fF). When midpoint sensing is employed in such a DRAM, the DRAM must move a cumulative 800 pF. of capacitance from its precharged level of $V_{cc}/2$ to $V_{cc}$ during the time between the initiation of sensing and the termination of the active period (which ordinarily corresponds to the initiation of the precharge period).

In a typical chip active period, sensing will generally be initated approximately 30 nS. prior to termination of the active period. During this 30 nS. time frame, sense and restore signals must be supplied to a series of two or more pull-up transistors of a sense amplifier coupled to the bit lines, such as the DRAM sense amaplifier represented in FIG. 1. In a conventional DRAM design, a first sense and restore signal will turn on a relatively small pull-up transistor. Subsequent sense and restore signals will then each turn on a somewhat larger pull-up transistor or a pair of such transistors. In this fashion the amount of current drawn through the pull-up transistors into the DRAM circuits is controlled somewhat by the size of the transistor used. Also, the relative timing between the initiation of these signals will further help control the surge of current associated with turning on the transistors.

This can be better understood by reference to FIG. 1. As is well known in the art, the differential developed between bit lines 10 and 12 may be amplified by means of a flip-flop arrangement of paired P channel and N channel transistors 14, 16, 18 and 20. The sense amplifier of FIG. 1 may be turned "on" by driving a line 22 towards $V_{cc}$ and driving a line 24 towards ground potential. Line 22 may be raised toward $V_{cc}$ by turning on a set of P channel transistors represented by transistors 26 and 28. Line 24 may be driven toward ground potential by turning on a set of N channel transistors represented by transistors 30 and 32.

Traditionally, each of paired transistors 26 and 30 is a smaller device than each of paired transistors 28 and 32. These first transistors 26 and 30 will be turned on first, thereby limiting the maximum current which may surge through to the sense amplifier by the actual physical limitations on the size of transistors 26 and 30. Once these transistors have been turned on for a period of time, the large transistors 28 and 32 will be turned on to deliver a larger current to complete the sense and restore operations.

In the circuitry of FIG. 1, transistor 30 is turned on by receipt of a first sensing signal $\phi_{s1}$ on a line 34. Similarly, transistor 32 is turned on by the receipt of a second sensing signal $\phi_{s2}$ on a line 36. Likewise, P channel transistors 26 and 28 are turned on by the logical complements of the first and second sensing signals received on lines 38 and 40, respectively. The timing between the first and second sensing signals determines the amount of time that the smaller transistors 26 and 30 are on before the larger transistors 28 and 32 are turned on. Correspondingly, this timing determines the current which will be drawn through transistor 28 into the DRAM circuitry when it is first turned on by reducing the source to drain potential across transistor 28 at that time.

This general method of turning on transistors in a sense amplifier at differing times is used to overcome the capacitance of bit lines 10 and 12. Consider that an amount of charge corresponding to the bit line capacitance must be supplied to the circuit. This may be done by supplying a large current for a short time or a small current for a longer time. In the method described with respect to FIG. 1, the turning on of the smaller transistors such as transistors 26 and 30 first and leaving them on for a period of time causes a certain amount of charge to be transferred to bit lines 10 and 12 to overcome partially the parasitic capacitance and raise the potential at the bit lines before the larger devices 28 and 32 are turned on. Then when the larger devices are turned on, they will allow a somewhat larger current to flow and deliver additional charge to the bit lines until they have been moved from a potential of $V_{cc}/2$ to $V_{cc}$. Thus, a sense amplifier as illustrated in FIG. 1 may be "turned on" in stages by means of time-staggered sense and restore signals to turn on increasingly larger pull-up transistors illustrated by the two P/N transistor pairs 26/30 and 28/32. This provides a gradual increase in current instead of a relatively unmanagable current surge all at once which would result from turning on all transistor pairs together.

Conventional logic circuitry for providing such time-staggered sense and restore signals is illustrated in FIG. 2. In the conventional approach for attempting to control the current drawn through the sense amplifier, a first sensing signal $\phi_{s1}$ is initiated at a time which follows the falling edge of $\overline{RAS}$ by a period of time which is dependent upon a delay time $t_0$. The delay time $t_0$ is the time required to set up the bit lines for sensing. This time is dependent upon the conditions in which the DRAM is operating e.g. temperature and power supply voltage.

After initiation of the first sensing signal $\phi_{s1}$, a second sensing signal $\phi_{s2}$ is generated after at a time which is dependent upon a delay time $t_1$. Time $t_1$ may be controlled typically by a series of MOS inverters as shown in FIG. 2 which interpose a delay determined by on-chip circuitry. For example, ten to twelve MOS inverters in series may be provided by the chip fabricator.

When $\overline{RAS}$ goes high indicating the initiation of the precharge period, both sensing signals $\phi_{s1}$ and $\phi_{s2}$ are terminated (in the prior art) by means of $\phi_{pre}$ signal.

More particularly, in the illustrative logic circuitry of FIG. 2, the row address strobe complement signal ($\overline{RAS}$) is received on a line 42. The $\overline{RAS}$ signal passes through inverter gates 43 to generate the $\phi_{pre}$ signal on a line 44. The $\phi$pre signal is the same logically as the $\overline{RAS}$ signal except that it is delayed by the delay time of gates 43. The $\phi$pre signal is used to enable NOR gates 46 and 48 for later generation of the first and second sensing signals. The first sensing signal $\phi_{s1}$ is generated after a delay time $t_0$ (plus the delay time of NOR gate 46); following the initiation of the $\phi$pre signal. The delay time $t_0$ is determined by the time required to set up the bit lines of the dynamic RAM, which time is represented by a delay block 50. The first sensing signal $\phi_{s1}$ generated at a point 52 is supplied to the sense amplifier via line 34 (FIG. 1). The $\phi_{s1}$ signal is input to an inverter 54 to generate $\overline{\phi_{s1}}$ the logical complement of the first sensing signal. The $\overline{\phi_{s1}}$ is and supplied to transistor 26 of FIG. 1 via line 38.

The second sensing signal $\phi_{s2}$ is generated after a delay time $t_1$ (plus the delay time of NOR gate 48) following the initiation of signal $\overline{\phi_{s1}}$. The delay time $t_1$ is determined by a series of MOS inverters 56 to create a determinable delay between the first and second sensing signals. Thus, after the initiation of the first sensing signal, the second sensing signal will be generated at the output of NOR gate 48 and fed via line 36 (FIG. 1) to N channel transistor 32 of FIG. 1. Similarly, inverter gate 58 may be used to generate the logical complement of the second sensing signal to turn on the larger transistor 28 of FIG. 1 via line 40. Thus, in this fashion, the art has attempted to control the current surge when bit line capacitance needs to be overcome.

This prior technique has led to some major disadvantages, however. A typical DRAM will be called upon to meet its specified access times over a large range of temperature, power supply and process parameters. The 30 nS. interval between the first set of sense and restore signals $\phi_{s1}$ and $\overline{\phi_{s1}}$ and the second set of sense and restore signals $\phi_{s2}$ and $\overline{\phi_{s2}}$ will typically be the "worst case," or slowest timing condition. The other extreme or "best case" timing will reduce the time interval for the sense and restore signals to about 15 nS.

In the best case condition, ambient temperature is about 0° C. and $V_{cc}=5.5$ volts. The DRAM circuit may have to move the 800 pF. of capacitance associated with the bit lines from about 2.25 volts to about 5.5 volts in 15 nS. That requires 2600 picoCoulombs of charge to be supplied through the $V_{cc}$ pin. Even if it were possible to supply this amount of charge with a perfectly triangular current waveform (to minimize current surge), it would still require a current ramp rate of 45 mA. per nS. up to a maximum current peak of 350 mA. Both of these parameters are unacceptably high for the typical DRAM circuit and will tend to degrade the chip power supply. Also, peripheral circuits may fail after repeated such current surges.

Alternatively, if the DRAM is operating in its "worst case," the circuit will operate slowest. That is, when the ambient temperature is approximately 100° C. and the power supply is approximately 4.5 volts, $t_0$ will be at its maximum value. Likewise, the $t_1$ MOS inverter delay period will be at its maximum value because of the slower operation of the inverter gates. The first sensing signal $\phi_{s1}$ will be initiated well into the chip active period, and the second sensing signal $\phi_{s2}$ will be generated after a relatively long delay at a time shortly before the chip active period terminates. Both of these sensing signals will be terminated at the end of the chip active period. Under these ambient conditions, the maximum current which may be generated is typically much less than would be generated under "best case" conditions. Accordingly, the delay between the first and second sensing signals need not be as long to provide the desired current stabilization. However, because of the delays inherent in this approach, the access time for the DRAM becomes unacceptable.

Thus, it can be seen that the method heretofore used in the art for overcoming the inherent capacitance of the bit lines under certain operating conditions would be incompatible with either the current limitations of the part or its required fast access times.

Accordingly, it is a principal object of the present invention to provide a technique for allowing desirable access times with controlled current drawn through the DRAM circuitry over a wide range of operating conditions.

It is a further object of the present invention to provide a technique for stabilizing the current through DRAM circuitry which does not allow the delay between first and second sensing signals to decrease as the circuitry operates faster, but does allow the delay between first and second sensing signals to decrease when the DRAM is operating slowest.

SUMMARY OF THE INVENTION

The present invention generally provides a technique for controlling current spikes involved with the bit lines of a random access memory while permitting fast access times over an entire range of operating conditions such as ambient temperature and power supply variations. The preferred method includes the steps of initiating a first sensing signal after a first delay period subsequent to the initiation of the active period. The first delay period varies with the temperature and power supply variations of the circuitry. The first sensing signal is used to turn on smaller devices in a sense amplifier so that current begins flowing. In this embodiment, the current will reach a peak and start to decay as the drain to source voltage decreases. Subsequently, a second sensing signal is generated and used to turn on larger devices in the sense amplifier, so that further current is applied to overcome the bit line capacity in stages. However, unlike the prior art, where the generation of the second (or subsequent) sensing signals is dependent on the generation of a prior sensing signal, according to one aspect of the present invention the second (or subsequent) sensing signal is not dependent. According to another feature of the invention, as the memory gets faster (as affected by operating conditions such as ambient temperature and VCC voltage level), the time interval between one sensing signal and a subsequent sensing signal will not decrease, but preferably will increase.

According to still another aspect of this invention, the second sensing signal will be dependent on a relatively steady signal. Preferably, this will be the $\overline{RAS}$ signal which has a relatively stable low time. In the preferred embodiment, the generation of the second sensing signal will be dependent on a transition of $\overline{RAS}$. Preferably, the second (or ultimate) sensing signal will be generated to complete the sense and restore functions in response to $\overline{RAS}$ going high, which would normally denote the completion of the DRAM active period when the DRAM returns to the precharge stage. However, in the preferred embodiment of this invention, some of the $\overline{RAS}$ high time is employed to complete the restore functions. This use of part of what would have been time dedicated to precharging the bit lines is feasible because where the precharge is to a level of $V_{cc}/2$, a fast precharge by shorting the bit lines together will still be possible in the remaining time. A method according to the present invention may further include the step of terminating the first and second sensing signals after a second delay period. The overall effect of the preferred method on cycle time is much less than merely extending the $\overline{RAS}$ low time. The result is an efficient sense and restore operation having inherently shorter cycle time than conventional circuitry, with proper access times over a wide range of conditions.

It will be appreciated that according to the foregoing aspects of the invention, the sense and restore operations are actually being performed during a period of time which exceeds the time between the falling and rising edge of the $\overline{RAS}$ signal. Likewise, the actual precharging of the bit lines does not commence immediately after the $\overline{RAS}$ signal goes high, but rather starts after the termination of the sensing signals. Therefore, from a functional point of view, new active and precharging periods are being defined. However, the "active period" as used hereinafter is defined as the normal active period, i.e. as the period of time between the falling and rising edge of the $\overline{RAS}$ signal. The "precharge period" as used hereinafter is defined as the normal precharge period, i.e. as the period of time during which the $\overline{RAS}$ signal is high.

The invented method may be practiced in a logic circuit including first logic means responsive to the initiation of the DRAM active period to generate a first or preliminary sensing signal after a first time delay determined by the time required to set up the bit lines for sensing. This first delay varies as a function of the circuit temperature and power supply variations. Second logic means then generates a second or final sensing signal in response illustratively to the completion of the DRAM active period at the initiation of the DRAM precharge period.

The preferred apparatus according to the present invention may further include third logic means responsive to the completion of the DRAM active period to terminate the sensing signals after a second selectable, on-chip delay period.

BRIEF DESCRIPTION OF THE FIGURES

The features of the present invention are set forth in the appended claims. The invention, together with objects and advantages thereof may be further understood by reference to the following detailed description taken in conjunction with the accompanying drawings in which like elements are indicated by like reference numerals and of which:

FIG. 4 is a timing diagram illustrating the timing relationship of conventional first and second paired sensing signals; and FIG. 5 is a collection of waveforms illustrating the timing of various signals, including first and second paired sensing signals, generated in accordance with the preferred embodiment of the present invention.

DETAILED DESCRIPTION OF A PREFERRED EMBODIMENT

The apparatus and method of the present invention are compatible with existing technology available in DRAM circuitry.

As explained supra, the traditional approach described with reference to FIGS. 1 and 2 does not properly accommodate time and temperature variations in the ambient conditions of the DRAM circuitry. Because $t_0$ decreases during the "fast" operation of the DRAM in response to ideal conditions, $t_1$ will likewise decrease. Therefore, the first and second sensing signals will be closer together during a time when the current is more likely to surge to higher values which are unacceptable for the DRAM circuitry.

Figure 1:
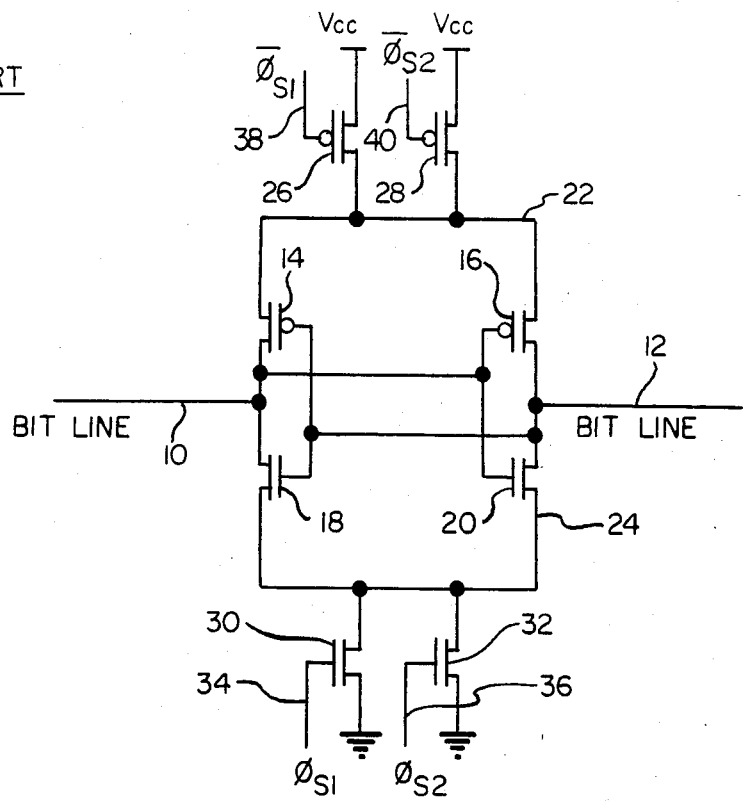
FIG. 1 is a circuit schematic of a prior art dynamic RAM sense amplifier adapted to receive first and second paired sensing signals.
Figure 2:
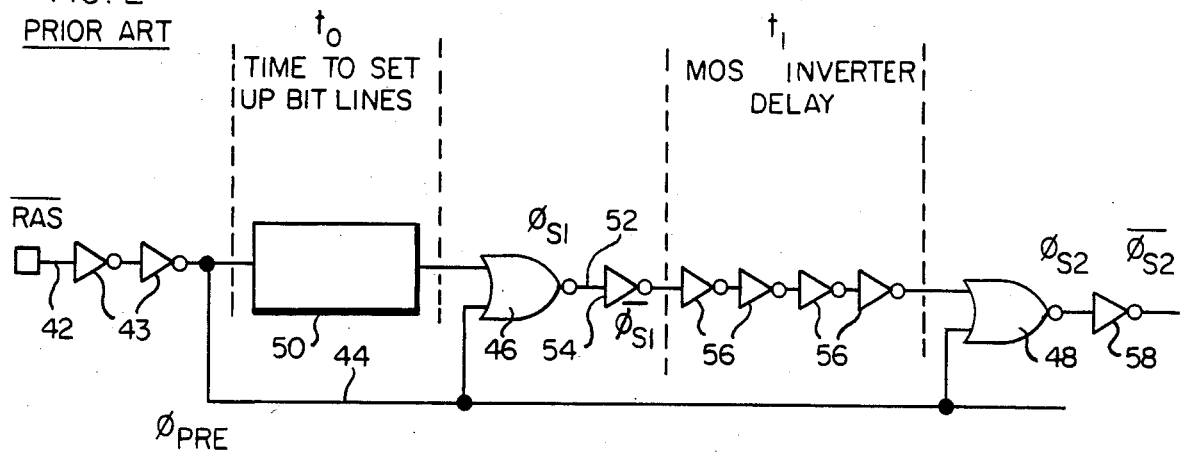
FIG. 2 is a schematic of logic circuitry used in the prior art to generate first and second paired sensing signals $\phi_{s1}$ and $\phi_{s2}$.
Figure 3:
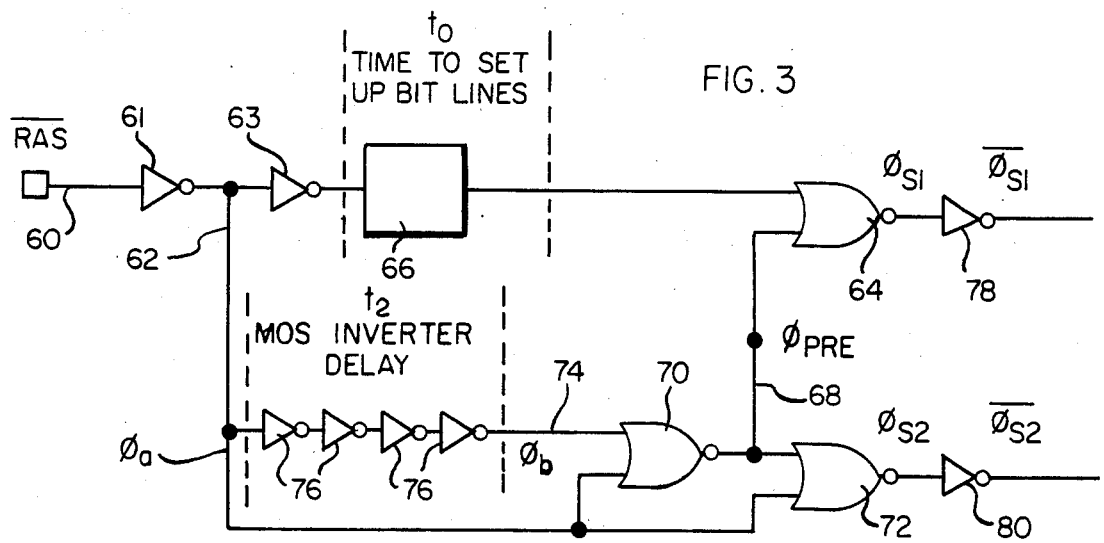
FIG. 3 is a schematic of logic circuitry which may be used in the preferred embodiment of the present invention to provide first and second paired sensing signals $\phi_{s1}$ and $\phi_{s2}$.

FIG. 3 shows a logic schematic representation of the preferred embodiment of the present invention for generating first and second paired sensing signals ($\phi_{s1}$, $\overline{\phi_{s1}}$ and $\phi_{s2}$, $\overline{\phi_{s2}}$) to drive a sense amplifier as illustrated in FIG. 1.

In FIG. 3, the $\overline{RAS}$ signal is received on a line 60, and its complement $\phi_a$ is generated by an inverter 61 on a line 62. These two signals are illustrated as the first two waveforms in FIG. 5. In a fashion similar to the conventional method, a first sensing signal $\phi_{s1}$ is generated at the output of a NOR gate 64 after a delay time $t_0$ (plus the delay times of gates 63 and 64) following the initiation of the $\phi_a$ signal Time $t_0$ represents the time required to set up the bit lines. This delay is affected by the temperature and power supply of the DRAM and is represented in FIG. 3 by a delay block 66. First sensing signal $\phi_{s1}$ may be generated at the output of NOR gate 64 because both inputs to NOR gate 64 will be low at that time. A signal on a line 68, labelled $\phi_{pre}$, will be low because the $\phi_a$ signal on line 62 serves as one input to a NOR gate 70 and is high as long as $\overline{RAS}$ is low. This guarantees that the output of NOR gate 70 on line 68 will be low. Thus, the first sensing signal will lag behind the initiation of the chip active period by a time which is dependent upon delay time $t_0$. Again, time $t_0$ represents the time required to set up the bit lines 10, 12, and is a variable dependent upon the temperature and power supply conditions of the dynamic RAM.

The generation of the second sensing signal $\phi_{s2}$ allows the preferred embodiment to adequately compensate against current surges and to stabilize the overall current drawn by the dynamic RAM during its sense and restore function. Because the $\phi_a$ signal on line 62 also serves as an input to a NOR gate 72, the second sensing signal $\phi_{s2}$ which is the output of NOR gate 72 will not be generated until after $\phi_a$ on line 62 falls to a low value. This can occur only after the $\overline{RAS}$ signal on line 60 goes high, indicating the termination of the active period and initiation of the chip precharge period. At that time, a second sensing signal can be generated at the output of NOR gate 72. It should be noted that at this time the $\phi_{pre}$ signal on line 68 will remain low, because even though the $\phi_a$ signal on the line 62 input to NOR gate 70 goes low, a $\phi_b$ signal on line 74, which is the other input to NOR gate 70, remains high for a delay period $t_2$ (plus the delay time of gate 61) following the initiation of the precharge period. In this fashion, the second sensing signal is not generated by circuitry which receives the first sensing signal as an input. To this extent, the second sensing signal is generated independently of the time at which the first sensing signal is generated. Rather than following the first sensing signal by a time delay interposed by a predetermined number of inverters, the second sensing signal $\phi_{s2}$ in the preferred embodiment will generally coincide with the initiation of the chip precharge period.

The generation of the second sensing signal independent of the first sensing signal allows apparatus and methods according to the present invention to compensate adequately for the temperature and power supply variations which may be found in the dynamic RAM operational environment. Rather than the delay between the first and second sensing signals being determined by a time $t_1$ which varies with the temperature and power supply in the same was as $t_0$, that delay is now a function of the active period, and preferably is the total time that $\overline{RAS}$ is low minus $t_0$. Thus, when $t_0$ is at its smallest value (i.e., the chip is operating in its fastest, "best case" mode), the delay between the first and second sensing signals will be at its longest. This is desired because the conditions which cause the circuitry of the dynamic RAM to operate "fastest" also provide the conditions most likely to produce an unacceptably high current surge through P channel transistor 28 if it is turned on too soon, while the voltage differential is too great. Thus, in the preferred embodiment of the present invention, P channel transistor 26 will typically be on for a longer period of time (and delivering charge) during those conditions in which unacceptably large current would be likely to surge through the large current transistor 28 if it were turned on quickly. By use of the invention, the maximum current drawn through the DRAM circuitry typically will not exceed that which is initially drawn through P-channel transistor 26. Because transistor 26 is a relatively small physical device, the current through it in most circumstances will be manageable.

When the DRAM (and its inverter circuits) are operating in the worst case mode (when it takes longer for the bit lines to be set up as measured by the time $t_0$ represented by block 66 in FIG. 3), the time period separating the first and second sensing signals will be shortest. This is desired, because the conditions which create the slowness in setting up the bit lines are also the same conditions which are unlikely to generate excessive current at any time. Thus, the period between initiation of the first and second sensing signals may be shortened. Further, because the second sensing signal generally coincides with the initiation of the chip precharge period, the surge created by the $\overline{RAS}$ signal going high at this juncture assists in completing the sensing and restore operations.

As mentioned previously, the $\phi_b$ signal on line 74 is the second input to the controlling NOR gate 70 in FIG. 3. This input is generated as a time delay of the $\phi_a$ signal present on line 62. Accordingly, when $\phi_a$ on line 62 goes low, indicating that the termination of the chip active period and the initiation of the chip precharge period has just occurred, the $\phi_b$ signal on line 74 will correspondingly go low a delay time $t_2$ later. When both inputs to NOR gate 70 are low, the $\phi_{pre}$ output of NOR gate 70 on line 68 wll go high (after the time delay of gate 70) which will disable NOR gates 64 and 72 to terminate the first and second sensing signals. Accordingly, the duration of the second sensing signal may be determined by the time $t_2$ which is determined through a series of MOS inverters 76.

It will be appreciated by those skilled in the art that in this fashion the second sensing signal endures for a period corresponding at least in part to the length of time necessary for the large current occasioned by the second sensing signal to accomplish the sense and restore functions. When the circuit is operating at a high temperature with a low power supply voltage, it is desirable for the second sensing signal to endure for a longer time to complete the sense and restore functions. In the preferred embodiment of the present invention, this will occur because the $t_2$ MOS delay is responsive to the same temperature and power supply variations that the $t_0$ delay responds to. This is in direct contrast to the conventional method in which the second sensing signal would endure for a shorter period of time when the circuit operates at its slowest.

The logic circuitry of FIG. 3 is compatible with the sense amplifier of FIG. 1. The first sensing signal at the output of NOR gate 64 is supplied via line 34 to first N-channel transistor 30; the logical complement of the first sensing signal from the output of an inverter 78 is supplied by via line 38 to the first P-channel transistor 26. Likewise, the second sensing signal at the output of NOR gate 72 is supplied via line 36 to the second N-channel transistor 32; the logical complement of the second sensing signal is supplied via line 40 to the large current P-channel transistor 28. In the typical 256K dynamic RAM chip, there will b 1,024 sense amplifiers and pairs of bit lines. However, the logic circuitry of FIG. 3 need be laid out on the chip architecture only once.

FIG. 4 shows $\overline{RAS}$, the $\phi_{pre}$ signal, the first and second sensing signals $\phi_{s1}$ and $\phi_{s2}$ and the respective timing relationships of the conventional method for providing the sense and restore functions. It will be appreciated from a brief analysis of these waveforms that the sense and restore functions are substantially accomplished during the chip active period when the $\overline{RAS}$ signal is low and that the second sensing signal is dependent upon the first sensing signal.

FIG. 5 shows a series of waveforms representing the relative timing between the $\overline{RAS}$ signal, the $\phi_{pre}$ signal, and the first and second sensing signals $\phi_{s1}$ and $\phi_{s2}$ generated in accordance with the method of the preferred embodiment of the present invention and various other waveforms generated according to the preferred embodiment of the present invention. It will be appreciated from an analysis of these waveforms that the second sensing signal is initiated after the chip active period has terminated and the precharge period has begun. Further, the second sensing signal is generated independently of the first sensing signal and in fact will lag further behind the first sensing signal as the chip operates faster. This is a preferable method of completing the sense and restore functions with much less of an impact on the overall chip cycle time than would occur if the active period were extended to allow adequate completion of the sense and restore functions. This is especially true when midpoint sensing is utilized because the bit lines need only be shorted together to equilibrate them during the precharge period.

Although the present invention has been described above in terms of a preferred embodiment, such changes and modifications as would be apparent to one skilled in the art and familiar with the teachings of this application are deemed to be within the spirit and scope of the present invention. For example, the present invention need not be limited to only two sensing signals, or applying signals to only two pairs of transistors. Other arrangements could be devised within the present invention according to various of its many aspects. There could be, for instance, three or more pairs of transistors in the sense amplifier and a corresponding number of sensing signals. Some of the sensing signals may be functions of one another, while other sensing signals will be independent of other sensing signals. There could be plural transistor pairs in the sense amplifier with a lesser number of distinct sensing signals being distributed among them. Some of the sensing signals could be combined to form further sensing signals. Nor is the invention limited to generating the second or ultimate sensing signal in response to $\overline{RAS}$ going high. Other signals may be used or developed so that the interval between switching on transistors in the sense amplifier would not decrease, but preferably would increase, as the DRAM gets faster. The use of a $\overline{RAS}$ transistion is intended to illustrate the best mode of the invention. Other schemes using the invention may be devised.

What is claimed is:

1. In a dynamic random access memory circuit having defined active and precharge periods, means for compensating for ambient environment variations to control current surges in said circuit comprising:
   control means responsive to the commencement of said active period for generating a control signal;
   first generating means coupled to receive said control signal and responsive to the commencement of said active period for generating a first sensing signal after a variable delay time following the commencement of said active period, said variable delay time being a function of the ambient environment within said memory circuit;
   second generating means coupled to receive said control signal and responsive to the termination of said active period for generating a second sensing signal; and
   timing means responsive to the termination of said active period and responsively coupled to said control means for causing said control signal to disable said first and second generating means at a preselected time delay after the termination of said active period, whereby the duration of said sensing signals is determined by said preselected delay.

2. The compensating means of claim 1 including means for generating the logical complements of said first and second sensing signals and wherein the memory circuit includes a sense amplifier having first and second paired inputs adapted to receive said first and second sensing signal and the logical complements of said sensing signals to drive said sense amplifier.

3. The compensating means of claim 2 wherein said first paired inputs are coupled to the gates of a first pair of transistors and said second paired inputs are coupled to the gates of a second pair of transistors and wherein said second pair of transistors are substantially larger devices than said first pair of transistors.

4. In a dynamic random access memory circuit having defined active and precharge periods and having bit lines requiring a set up time for sensing, a method for compensating for temperature and power supply variations to control current surges in said memory comprising:
   sensing a first row address strobe signal transition to indicate the commencement of said active period;
   generating a preliminary sensing signal in response to said first row address strobe signal transition after a first temperature and power supply variable delay determined by the time required to set up the bit lines;
   sensing a second row address strobe signal transition to indicate the commencement of said precharge period;
   generating a final sensing signal in response to said second address strobe row signal transition; and
   terminating said preliminary and final sensing signals at a second predetermined delay after said second row address strobe signal transition.

5. In a dynamic RAM having a timing signal having first and second signal transitions with a relatively constant time interval therebetween, said RAM including bit lines requiring a sensing set up time which varies as a function of the RAM's operating voltage and temperature, said RAM further including a sense amplifier for sensing a voltage differential between the bit lines, said sense amplifier having first and second current control inputs for controlling current drawn by said amplifier, sense amplifier control circuitry comprising:
   means for providing a first time delay which varies as a function of the RAM's operating voltage and temperature;
   means responsive to said timing signal and said first time delay for initiating first and second sensing signals, said initiating means providing a time interval between said first sensing signal initiation and said second signal initiation which increases as the bit line sensing set up time decreases and which decreases as the bit line sensing set up time increases; and
   means for coupling said first and second sensing signals to said first and second sense amplifier current control inputs.

6. The sense amplifier control circuitry of claim 5 further including:
   means for providing a second time delay which varies as a function of the RAM's operating voltage and temperature; and
   means responsive to said timing signal and said second delay time for terminating said first and second sensing signals after said second delay time following the second signal transition of said timing signal.

7. The sense amplifier control circuitry of claim 5 wherein said timing signal is derived from a row address strobe signal.

8. The sense amplifier control circuitry of claim 5 wherein said first time delay is approximately equal to the bit line sensing set up time.

9. The sense amplifier control circuitry of claim 8 wherein said means for providing said second time delay comprises a series of MOS inverters.

10. The sense amplifier control circuitry of claim 5 wherein said first and second sense amplifier current control inputs are respectively coupled to the gates of first and second transistors within said sense amplifier and wherein said first transistor is a substantially smaller device than said second transistor.

11. The sense amplifier control circuitry of claim 10 wherein said sense amplifier includes third and fourth current control inputs and further including:
- means for generating the logical complements of said first and second sensing signals; and
- means for respectively coupling said logical complements of said first and second sensing signals to said third and fourth sense amplifier current control inputs.

12. The sense amplifier control circuitry of claim 11 wherein said third and fourth sense amplifier current control inputs are respectively coupled to the gates of third and fourth transistors within said sense amplifier and wherein said third transistor is a substantially smaller device than said fourth transistor.

13. The sense amplifier control circuitry of claim 12 wherein said first and second transistors are N channel devices and said third and fourth transistors are P channel devices.

14. The compensating means of claim 1 wherein the memory circuit includes bit lines requiring a set up time for sensing and wherein said variable delay time is approximately equal to the time required to set up the bit lines for sensing.

* * * * *